United States Patent
Zhu et al.

(10) Patent No.: US 11,677,209 B2
(45) Date of Patent: Jun. 13, 2023

(54) BLIND PUMP LASER DETECTION

(71) Applicant: II-VI DELAWARE, INC., Wilmington, DE (US)

(72) Inventors: Zhiqian Zhu, Shanghai (CN); Ian Peter McClean, Brixham (GB); Yongjun Fu, Shanghai (CN); Yongshi Gu, Shanghai (CN)

(73) Assignee: II-VI DELAWARE, INC., Wilmington, DE (US)

( * ) Notice: Subject to any disclaimer, the term of this patent is extended or adjusted under 35 U.S.C. 154(b) by 402 days.

(21) Appl. No.: 16/903,246

(22) Filed: Jun. 16, 2020

(65) Prior Publication Data
US 2021/0184420 A1 Jun. 17, 2021

(30) Foreign Application Priority Data
Dec. 13, 2019 (CN) .......................... 201911283703.9

(51) Int. Cl.
*H01S 3/13* (2006.01)
*H01S 3/067* (2006.01)
*H01S 3/094* (2006.01)
*G01R 19/165* (2006.01)
(Continued)

(52) U.S. Cl.
CPC ...... *H01S 3/1305* (2013.01); *G01R 19/16571* (2013.01); *H01S 3/0677* (2013.01); *H01S 3/06716* (2013.01); *H01S 3/094003* (2013.01); *H01S 3/10023* (2013.01);
(Continued)

(58) Field of Classification Search
None
See application file for complete search history.

(56) References Cited

U.S. PATENT DOCUMENTS

| 5,245,690 A | 9/1993 | Aida et al. |
| 5,703,711 A | 12/1997 | Hamada |
| 6,111,688 A | 8/2000 | Kobayashi et al. |
| (Continued) | | |

FOREIGN PATENT DOCUMENTS

| DE | 102005046936 A1 | 4/2007 |
| GB | 2344209 A | 5/2000 |

OTHER PUBLICATIONS

Search Report issued in GB2019572.3 dated Jun. 8, 2021.
Search Report issued in French Patent Application No. 20 13078 dated Apr. 21, 2022.

*Primary Examiner* — Eric L Bolda
(74) *Attorney, Agent, or Firm* — Blank Rome LLP

(57) ABSTRACT

An EDFA may include an input photodiode configured to generate a control signal based on an input signal. The EDFA may include a blind stage configured to generate an amplified signal based on the control signal and the input signal. The EDFA may include a non-blind stage configured to generate an output signal based on the amplified signal within the blind stage, the control signal, and a feedback signal. The EDFA may include a filter configured to generate a filtered signal based on the output signal. The EDFA may include an output photodiode configured to generate the feedback signal based on the filtered signal. The EDFA may include an alarm device. A signal within the non-blind stage may be generated based on the feedback signal and the control signal. The alarm device may be configured to generate an alarm signal when the signal exceeds a threshold value.

23 Claims, 4 Drawing Sheets

(51) Int. Cl.
*H01S 3/16* (2006.01)
*H01S 3/10* (2006.01)

(52) U.S. Cl.
CPC .......... *H01S 3/1301* (2013.01); *H01S 3/1608* (2013.01); *H01S 2301/02* (2013.01)

(56) References Cited

U.S. PATENT DOCUMENTS

| | | | |
|---|---|---|---|
| 6,304,371 B1 | 10/2001 | Sugiya et al. | |
| 6,377,394 B1 * | 4/2002 | Drake | H01S 3/13013 |
| | | | 359/341.41 |
| 6,671,084 B2 * | 12/2003 | Kosaka | H04B 10/296 |
| | | | 359/341.32 |
| 6,687,049 B1 | 2/2004 | Sulhoff et al. | |
| 2002/0093729 A1 | 7/2002 | Gerish et al. | |
| 2004/0051938 A1 | 3/2004 | Chan et al. | |
| 2004/0057732 A1 | 3/2004 | Usui et al. | |
| 2004/0240044 A1 | 12/2004 | Park et al. | |
| 2007/0058241 A1 | 3/2007 | Chang et al. | |
| 2008/0074731 A1 * | 3/2008 | Takeyama | H01S 3/06758 |
| | | | 359/333 |
| 2014/0029082 A1 | 1/2014 | Itoh | |
| 2016/0261087 A1 * | 9/2016 | Uehara | H01S 3/1306 |

* cited by examiner

BLIND PUMP LASER DETECTION

CROSS-REFERENCE TO RELATED APPLICATION

This application claims the benefit of and priority to Chinese Application No. 201911283703.9 filed on Dec. 13, 2019. The 201911283703.9 is incorporated herein by reference.

FIELD

The embodiments discussed in the present disclosure are related to blind pump laser detection.

BACKGROUND

Unless otherwise indicated in the present disclosure, the materials described in the present disclosure are not prior art to the claims in the present application and are not admitted to be prior art by inclusion in this section.

An optical transmission system may include an erbium doped fiber amplifier (EDFA) configured to amplify an optical signal. The EDFA may extend a transmission distance of the optical signal within the optical transmission system. In some embodiments, the EDFA may amplify the optical signal to compensate for loss that occurs due to attenuation in optical cables or other optical losses to direct data along correct fibre links within the optical transmission system. Amplifying the optical signal to compensate for the loss that occurs in the optical paths may permit the optical signal to be transmitted longer distances by the optical transmission system versus optical transmission systems that do not include the EDFA.

The subject matter claimed in the present disclosure is not limited to implementations that solve any disadvantages or that operate only in environments such as those described above. Rather, this background is only provided to illustrate one example technology area where some implementations described in the present disclosure may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described in the present disclosure generally relate to blind pump laser detection.

One or more embodiments of the present disclosure may include an EDFA that includes an input photodiode, a blind stage, a non-blind stage, a filter, an output photodiode, and an alarm device. The input photodiode may be configured to generate a control signal. The control signal may be generated based on an input signal. The blind stage may be coupled to the input photodiode and may be configured to generate an amplified signal. The amplified signal may be generated based on the control signal from the input photodiode and the input signal. The non-blind stage may be coupled to the input photodiode and the blind stage and may be configured to generate an output signal. The output signal may be generated based on the amplified signal of the blind stage, the control signal from the input photodiode, and a feedback signal. A driver signal within the non-blind stage may be generated based on the feedback signal and the control signal from the input photodiode. The filter may be coupled to the non-blind stage and may be configured to generate a filtered signal. The filtered signal may be generated based on the output signal from the non-blind stage. The output photodiode may be coupled to the filter and may be configured to generate the feedback signal. The feedback signal may be generated based on the filtered signal from the filter. The alarm device may be coupled to the non-blind stage. The alarm device may be configured to generate an alarm signal when the driver signal within the non-blind stage exceeds a threshold value.

One or more embodiments of the present disclosure may include an EDFA that includes an input photodiode, a feed forward controller, a first pump laser, a first amplifier, a feedback controller, a second pump laser, a second amplifier, a filter, an output photodiode, and an alarm device. The input photodiode may be optically coupled to an input of the EDFA. The feed forward controller may be electrically coupled to an output of the input photodiode. The first pump laser may be electrically coupled to an output of the feed forward controller. The first amplifier may be optically coupled to an output of the first pump laser and the input of the EDFA. The feedback controller may be electrically coupled to the output of the input photodiode. The second pump laser may be electrically coupled to an output of the feedback controller. The second amplifier may be optically coupled to an output of the second pump laser, an output of the first amplifier, and an output of the EDFA. The filter may be optically coupled to an output of the second amplifier. The output photodiode may be optically coupled to an output of the filter and may be electrically coupled to an input of the feedback controller. The alarm device may be coupled to the feedback controller.

One or more embodiments of the present disclosure may include a method that includes generating a control signal based on an input signal. The method includes generating an amplified signal based on the control signal and the input signal. The method includes generating an output signal based on the amplified signal, the control signal, and a feedback signal. The method includes generating a filtered signal based on the output signal. The method includes generating the feedback signal based on the filtered signal. The method includes generating a driver signal based on the feedback signal and the control signal. The method includes generating an alarm signal when the driver signal exceeds a threshold value.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1:
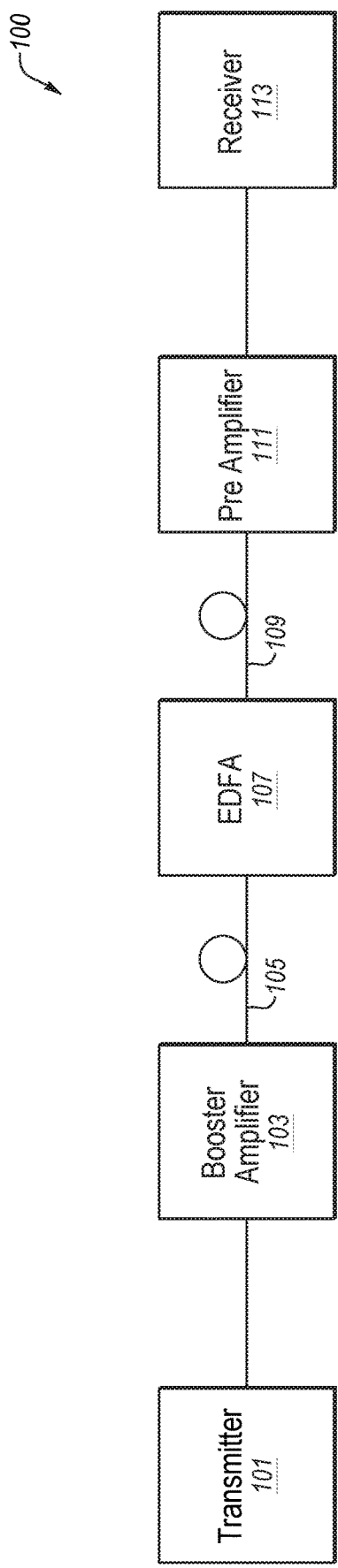
FIG. 1 illustrates a block diagram of an example optical transmission system.

An optical transmission system may include an EDFA so as to extend a distance an optical signal may be transmitted within an optical transmission system. In some embodiments, the EDFA may include a blind stage and a non-blind stage to amplify the optical signal. In these and other embodiments, the blind stage may include a feed forward pump laser, also referred to as a first pump laser, that is open loop controlled (e.g., feed forward controlled). The first pump laser may generate a first pump light. The first pump light from the first pump laser may be combined with the optical signal to drive a first amplifier. In an example, a first combined signal that includes the first pump light and the optical signal may drive the first amplifier. In more detail, for instance, the first pump light may energize erbium ions in the first amplifier followed by stimulated emission from the optical signal passing through the first amplifier with the energized erbium ions. In particular, when the photons of the optical signal interact with the excited erbium ions of the first amplifier, the erbium ions may give up some of their energy to the optical signal in the form of photons at the same wavelength as the photons of the optical signal, with the erbium ions returning to a lower energy state.

In some embodiments, the non-blind stage may include a feedback pump laser, also referred to as a second pump laser, that is closed loop controlled (e.g., feedback controlled). The second pump laser may generate a second pump light. The second pump light from the second pump laser may be combined with an amplified signal generated by the first amplifier to drive a second amplifier. In an example, a second combined signal that includes the second pump light and the amplified signal may drive the second amplifier. In more detail, for instance, the second pump light may energize erbium ions in the second amplifier followed by stimulated emission from the amplified signal passing through the second amplifier with the energized erbium ions. In particular, when the photons of the amplified signal interact with the excited erbium ions of the second amplifier, the erbium ions may give up some of their energy to the amplified signal in the form of photons at the same wavelength as the photons of the amplified signal, with the erbium ions returning to a lower energy state.

The second amplifier may generate an output signal based on the second combined signal. The output signal may be a twice amplified optical signal, e.g., the optical signal after amplification by both the first amplifier of the blind stage and the second amplifier of the non-blind stage. If the first pump laser fails, the first amplifier may become lossy (e.g., small or no optical data signals may pass through the first amplifier) caused by the optical power level of the first pump light approaching zero. Subsequently, the optical signal power at the output of the first amplifier may approach, or become zero. The low or zero optical signal may enter the second amplifier. The second amplifier may be controlled by both the signal power detected on the input photodiode to the first amplifier and the feedback signal from the output of the second amplifier and may control the level of optical pump power from the second pump laser (e.g., the second pump light) injected into the second amplifier aiming to maintain a target signal power at the output photodiode. With little or no optical signal entering the second amplifier an increase in the second pump laser optical power may generate high levels of Amplified Spontaneous Emission (ASE) noise within the second amplifier with a reduced signal power amplification. Thus, although the target total power may be achieved at the output of the EDFA, the Optical Signal to Noise Ratio (OSNR) at the output of the EDFA may be below an acceptable level. The decreased OSNR may cause the EDFA and the optical transmission system to not operate properly. Because the output power of the EDFA can still be achieved, some EDFA technologies may not include methods to detect if the first amplifier is the cause of the system degradation and a network control scheme may not be able to quickly restore correct system operation.

Some EDFA technologies may not include adequate monitoring devices or processes to determine if any part of the EDFA is failing.

Furthermore, after an EDFA is identified as having failed from a pump laser failure, both the first pump laser and the second pump laser may be replaced without trying to determine which of the first pump laser or the second pump laser is the cause of the EDFA failure. Replacing both the first pump laser and the second pump laser each time the EDFA fails may increase a cost associated with maintaining the optical transmission system with the EDFA.

Some EDFA technologies may include an extra photodiode placed before or after the first pump laser to provide a method to monitor correct operation of each amplifier. In these EDFA technologies, the extra photodiode may operate as a feedback device to directly monitor operational parameters of the first pump laser (e.g., the optical power level of the first pump light or the optical power level of a driver signal within the blind stage). However, including the extra photodiode may increase a production cost associated with the EDFA. In addition, including the extra photodiode may increase a complexity and difficulty of circuit design for the EDFA. Further, including the extra photodiode may increase a circuit footprint of the EDFA.

Some EDFA technologies may implement a back-facet monitor (BFM) to monitor the first pump laser. In these EDFA technologies, the BFM may detect the optical power level of an optical signal being emitted from the first pump laser. However, the BFM may provide inconsistent results due to the BFM being significantly impacted by temperatures, polarization states, and aging of reflection light. Thus, the BFM may cause false alarms (e.g., false fails) to occur. In addition, in some implementations, a single BFM detects light from two laser chips in a single package. In the event of a failure of one of the two laser chips, it may not be possible to detect which of the two laser chips has failed using the single BFM. BFMs may also increase a production cost associated with or a complexity of the circuit design for EDFAs.

Some embodiments described in the present disclosure may include systems, methods, or apparatuses to reliably verify proper operation of the EDFA (e.g., the first pump laser) without significantly increasing the production cost or the complexity of the circuit design. According to at least one embodiment described in the present disclosure, the EDFA may include a filter coupled to the non-blind stage. The filter may be configured to generate a filtered signal based on the output signal. In some embodiments, the filter may be a passband filter configured to permit portions of the output signal within an L frequency band (e.g., L-band) to pass through the filter. An output photodiode may be coupled to the filter. The output photodiode may generate a feedback signal based on the filtered signal. The L-band may include a wavelength range of about 1565 nanometers to 1605 nanometers.

A driver signal within the non-blind stage may be generated based at least in part on the feedback signal. In some embodiments, if the first pump laser fails, the output signal from the second amplifier may primarily include ASE in a C frequency band (e.g., a C-band ASE) and may be filtered out by the filter, which may cause a current level of the feedback signal to approach zero amps. Consequently, a current level of the driver signal may increase to compensate for the decreasing current level of the feedback signal. The C-band may include a wavelength range of about 1528 nanometers to 1565 nanometers. The filter may be referred to as a C/L-band filter in some examples where it blocks frequencies in the C-band and passes frequencies in the L-band.

In some embodiments, the EDFA may include an alarm device that is configured to monitor the current level of the driver signal within the non-blind stage. In these and other embodiments, the alarm device may generate an alarm signal when the current level of the driver signal within the non-blind stage exceeds a threshold value. Therefore, at least one embodiment described in the present disclosure may indirectly monitor the blind stage (e.g., the first pump laser) and permit the alarm signal to be generated to indicate that the EDFA has failed.

Accordingly, at least one embodiment described in the present disclosure may permit a network provider (e.g., an entity that provides or maintains the optical transmission system) to reliably determine if the EDFA has failed even if the first pump laser is the cause of the failure. In addition, in some embodiments, the filter may be implemented as a passive thin-film component that is cost effective and does not increase the complexity or the difficulty of the circuit design of the EDFA. Further, in some embodiments, the filter may be integrated into an output photodiode to further reduce circuit complexity. At least one embodiment described in the present disclosure may include a circuit footprint that is smaller than EDFA technologies that implement the extra photodiode. At least one embodiment described in the present disclosure may be implemented in the EDFA within high optical power level to low optical power level operating conditions or without wavelength dependence.

Thus, some embodiments herein may include a C/L-band filter before the output photodiode. In the case where the first pump laser fails, the inversion level of the first amplifier (which may include, e.g., a first erbium-doped fiber) of the blind stage may drop sharply, thereby generating strong absorption of the optical signal. In the absence of receiving the amplified signal at the second amplifier (which may include, e.g., a second erbium-doped fiber) as a result of the strong absorption of the optical signal by the first amplifier, the second amplifier may only or primarily generate C-band stimulated spontaneous emission under excitation of the second pump laser and does not produce an effective L-band signal. In this way, by adding the C/L-band filter before the output photodiode, the C-band stimulated spontaneous emission may be prevented from reaching the output photodiode. As a result, the output photodiode may trigger the alarm device to issue an error message, e.g., an alarm signal, due to the lack of signal power in the L-band.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

FIG. 1 illustrates a block diagram of an example optical transmission system 100, in accordance with at least one embodiment described in the present disclosure. The optical transmission system 100 may include a transmitter 101, a booster amplifier 103, a first optical cable 105, an EDFA 107, a second optical cable 109, a pre-amplifier 111, and a receiver 113. The transmitter 101 may be optically coupled to the booster amplifier 103. The booster amplifier 103 may be optically coupled to the EDFA 107 via the first optical cable 105. The EDFA 107 may be optically coupled to the pre-amplifier 111 via the second optical cable 109. The pre-amplifier 111 may be optically coupled to the receiver 113.

The first optical cable 105 or the second optical cable 109 may include multi-mode fiber (MMF) cables, single mode fiber (SMF) cables, multi-fiber ribbon cables, or any other suitable optical signal transmission media. The optical transmission system 100 may be configured for optical signal transmission at a variety of data rates including 1.25 Gb/s, 2.125 Gb/s, 2.5 Gb/s, 4.25 Gb/s, 8.5 Gb/s, 10.3 Gb/s, 10.5 Gb/s, 11.3 Gb/s, 14.025 Gb/s, 25 Gb/s, 50 Gb/s, 100 Gb/s, or other suitable data rate. Furthermore, the optical transmission system 100 may be configured for optical signal transmission at various wavelengths including 850 nm, 1310 nm, 1470 nm, 1490 nm, 1510 nm, 1530 nm, 1550 nm, 1570 nm, 1590 nm, 1610 nm, or other suitable wavelength.

The transmitter 101 may generate an optical signal that is to be transmitted to the receiver 113. The transmitter 101 may provide the optical signal to the booster amplifier 103. The booster amplifier 103 may be configured to increase the optical power level of the optical signal prior to reaching the first optical cable 105. The EDFA 107 may receive the optical signal via the first optical cable 105. The EDFA 107 may receive the optical signal at a reduced optical power level due to loss that occurs in the first optical cable 105. The loss that occurs in the first optical cable 105 may be due to attenuation in the first optical cable 105.

The EDFA 107 may operate as an inline amplifier to compensate for the loss that occurs in the first optical cable 105. In addition, the EDFA may operate as an inline amplifier to compensate for loss that occurs in the second optical cable 109. The EDFA 107 may amplify the optical power level of the optical signal prior to reaching the second optical cable 109. Further, the EDFA 107 may provide the optical signal to the pre-amplifier 111 via the second optical cable 109. The pre-amplifier 111 may be configured to increase the optical power level of the optical signal to an optical power level that can be received and processed by the receiver 113. The optical transmission system 100 may permit data to be transferred from the transmitter 101 to the receiver 113 using the optical signal. Inclusion of the EDFA 107 in the optical transmission system 100 may extend a distance that the optical signal may properly be transmitted without losing data. FIG. 1 illustrates the optical transmission system 100 with a single EDFA 107. In other implementations, the optical transmission system 100 may include any number of EDFAs inline to extend the distance the optical signal may be transmitted even more.

Figure 2:
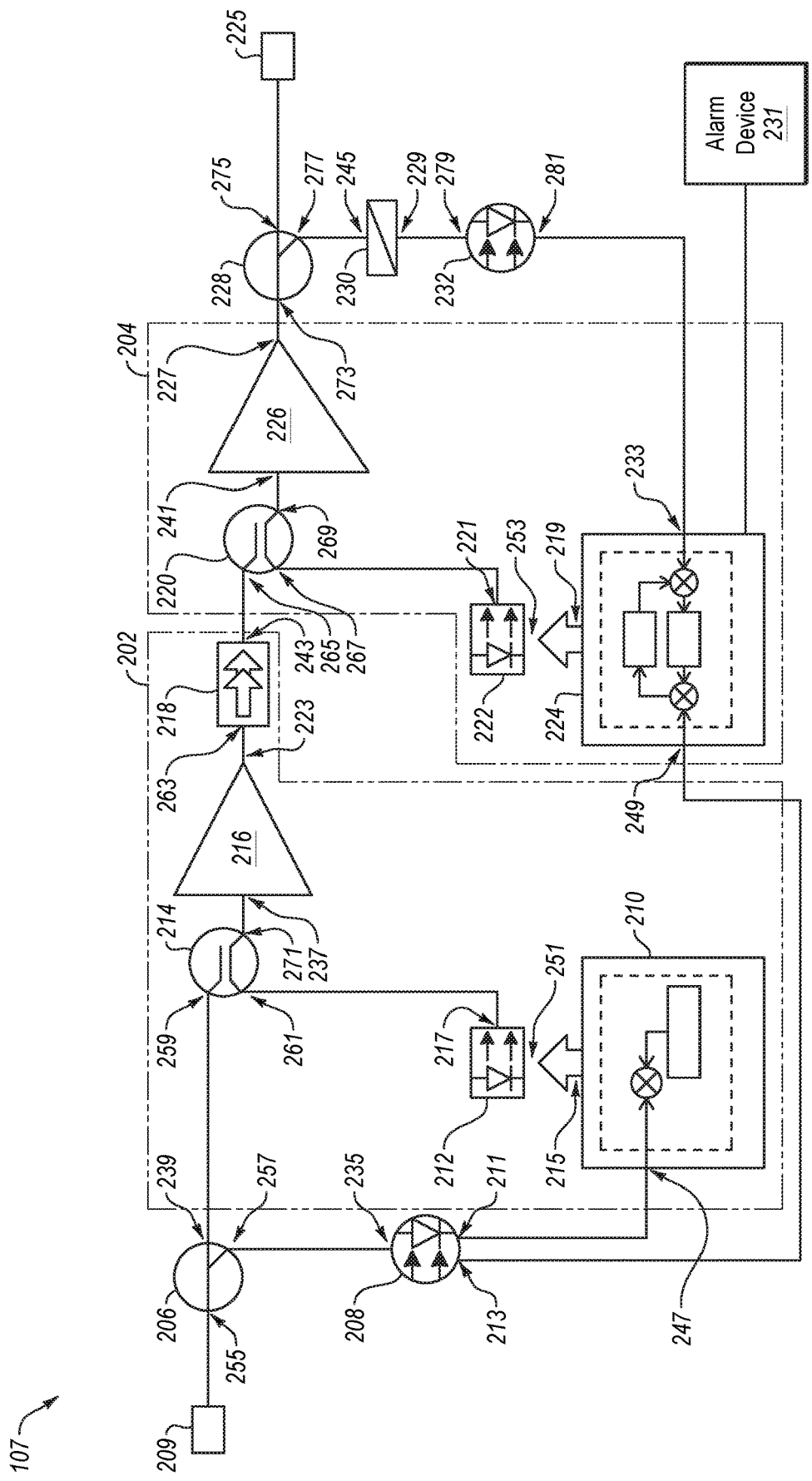
FIG. 2 illustrates an example EDFA that may be implemented in the optical transmission system of FIG. 1.

FIG. 2 illustrates an example EDFA 107 that may be implemented in the optical transmission system 100 of FIG. 1, in accordance with at least one embodiment described in the present disclosure. The EDFA 107 may include a first optical splitter 206, an input photodiode 208, a blind stage 202, a non-blind stage 204, a second optical splitter 228, a filter 230, an output photodiode 232, and an alarm device 231. The blind stage 202 may include a feed forward controller (FFC) 210, a first pump laser 212, a first optical combiner 214, a first amplifier 216, and an optical isolator 218. The non-blind stage 204 may include a feedback controller 224, a second pump laser 222, a second optical combiner 220, and a second amplifier 226.

An input 255 of the first optical splitter 206 may be optically coupled to an input 209 of the EDFA 107. A first output 239 of the first optical splitter 206 may be optically coupled to a first input 259 of the first optical combiner 214. A second output 257 of the first optical splitter 206 may be optically coupled to an input 235 of the input photodiode 208. An output of the input photodiode 208 may be split into multiple connections. For example, the output of the input photodiode may be split into a first output (denoted in FIG. 2 as 211) and a second output (denoted in FIG. 2 as 213). The first output 211 may be electrically coupled to an input 247 of the FFC 210. An output 215 of the FFC 210 may be electrically coupled to an input 251 of the first pump laser 212. An output 217 of the first pump laser 212 may be optically coupled to a second input 261 of the first optical combiner 214. An output 271 of the first optical combiner 214 may be optically coupled to an input 237 of the first amplifier 216. An output 223 of the first amplifier 216 may be optically coupled to an input 263 of the optical isolator 218. An output 243 of the optical isolator 218 may be optically coupled to a first input 265 of the second optical combiner 220.

The second output 213 may be electrically coupled to a first input 249 of the feedback controller 224. An output 219 of the feedback controller 224 may be electrically coupled to an input 253 of the second pump laser 222. An output 221 of the second pump laser 222 may be optically coupled to a second input 267 of the second optical combiner 220. An output 269 of the second optical combiner 220 may be optically coupled to an input 241 of the second amplifier 226. An output 227 of the second amplifier 226 may be optically coupled to an input 273 of the second optical splitter 228. A first output 275 of the second optical splitter 228 may be optically coupled to an output 225 of the EDFA 107. A second output 277 of the second optical splitter 228 may be optically coupled to an input 245 of the filter 230. An output 229 of the filter 230 may be optically coupled to an input 279 of the output photodiode 232. An output 281 of the output photodiode 232 may be electrically coupled to a second input 233 of the feedback controller 224.

In some embodiments, the EDFA 107 may be configured to operate as an optical amplifier and amplify the optical signal. In these and other embodiments, the EDFA 107 may operate in the C-band, the L-band, or both the C-band and the L-band. The blind stage 202 (e.g., the first pump laser 212) may be open loop controlled and the non-blind stage 204 (e.g., the second pump laser 222) may be closed loop controlled. In some embodiments, the blind stage 202 may operate without a direct failure detection device. In these and other embodiments, the alarm device 231 may operate as an indirect failure detection device for the blind stage 202 to determine if the blind stage 202 is operating properly.

The first optical splitter 206 may receive the optical signal (e.g., an input signal) from the input 209 of the EDFA 107. The first optical splitter 206 may split and provide the input signal to the input photodiode 208 and the first optical combiner 214. In some embodiments, the first optical splitter 206 may divide the optical power level of the input signal between the first output 239 and the second output 257 of the first optical splitter 206. In these and other embodiments, the first optical splitter 206 may equally or unequally divide the optical power level of the input signal between the first output 239 and the second output 257 of the first optical splitter 206. Additionally or alternatively, the input photodiode 208 and the first optical combiner 214 may receive the input signal at divided optical power levels.

The input photodiode 208 may receive the input signal from the first optical splitter 206. The input photodiode 208 may generate a control signal based on the input signal. In some embodiments, the input photodiode 208 may generate the control signal as an electrical signal representative of the input signal. In these and other embodiments, a current level of the control signal may be based on the divided optical power level of the input signal that the input photodiode 208 receives.

The FFC 210 may receive the control signal from the input photodiode 208. The FFC 210 may generate a driver signal within the blind stage 202, also referred to as a second driver signal, as an electrical signal based on the control signal. In some embodiments, the current level of the second driver signal may be based on the current level of the control signal. For example, if the current level of the control signal increases, the FFC 210 may increase the current level of the second driver signal. As another example, if the current level of the control signal decreases, the FFC 210 may decrease the current level of the second driver signal. In some embodiments, the FFC 210 may apply a gain level to the control signal to generate the second driver signal as an amplified version of the control signal.

The first pump laser 212 may receive the second driver signal from the FFC 210. The first pump laser 212 may generate a first pump light based on the second driver signal. In some embodiments, the first pump laser 212 may generate the first pump light as representative of the second driver signal. In these and other embodiments, the optical power level of the first pump light may be based on the current level of the second driver signal.

The first optical combiner 214 may receive the input signal at the divided optical power level from the first optical splitter 206. In addition, the first optical combiner 214 may receive the first pump light from the first pump laser 212. The first optical combiner 214 may combine the input signal and the first pump light as a first combined signal. In addition, the first optical combiner 214 may provide the first combined signal to the first amplifier 216. In some embodiments, the optical power level of the first combined signal may be equal to a sum of the optical power levels of the input signal and the first pump light received by the first optical combiner 214. In other embodiments, the optical power level of the first combined signal may be greater than the individual optical power level of the input signal or the first pump light but less than the sum of these optical power levels.

The first amplifier 216 may receive the first combined signal from the first optical combiner 214. The first amplifier 216 may generate an amplified signal based on the first combined signal. For example, the first pump light of the first combined signal may excite erbium ions in the first amplifier 216 which may amplify the input signal through stimulated emission, thereby generating the amplified signal. In some embodiments, the first amplifier 216 may be configured to apply a gain to the first combined signal such that the amplified signal is generated as an amplified version of the first combined signal. In these and other embodiments, the first combined signal may drive the first amplifier 216. The optical isolator 218 may permit the amplified signal from the first amplifier 216 to reach the first input 265 of the second optical combiner 220. In addition, the optical isolator 218 may be configured to prevent, or at least reduce, back reflection of light from the second optical combiner 220 to the first amplifier 216.

The feedback controller 224 may receive the control signal from the input photodiode 208. In addition, the feedback controller 224 may receive a feedback signal as an electrical signal from the output photodiode 232. The feedback controller 224 may generate a driver signal within the non-blind stage 204, also referred to as a first driver signal, as an electrical signal based on the control signal and the feedback signal. In some embodiments, the feedback controller 224 may be configured as a P.I. controller. In these and other embodiments, the current level of the first driver signal may be based on the current level of the control signal or the current level of the feedback signal. In some embodiments, the current level of the first driver signal may be based on a difference between the current level of the control signal and the current level of the feedback signal.

The second pump laser 222 may receive the first driver signal from the feedback controller 224. The second pump laser 222 may generate a second pump light based on the first driver signal. In some embodiments, the second pump laser 222 may generate the second pump light as representative of the first driver signal. In these and other embodiments, the optical power level of the second pump light may be based on the current level of the first driver signal.

The second optical combiner 220 may receive the amplified signal from the optical isolator 218 and the second pump light from the second pump laser 222. The second optical combiner 220 may combine the amplified signal and the second pump light as a second combined signal. In addition, the second optical combiner 220 may provide the second combined signal to the second amplifier 226. In some embodiments, the optical power level of the second combined signal may be equal to a sum of the optical power levels of the amplified signal and the second pump light. In other embodiments, the optical power level of the second combined signal may be greater than the individual optical power level of the amplified signal or the second pump light but less than the sum of these optical power levels.

The second amplifier 226 may receive the second combined signal from the second optical combiner 220. The second amplifier 226 may generate the output signal as an optical signal based on the second combined signal. In some embodiments, the second amplifier 226 may be configured to apply a gain to the second combined signal such that the output signal is generated as an amplified version of the second combined signal. For example, the second pump light of the second combined signal may excite erbium ions in the second amplifier 226 which may amplify the amplified signal through stimulated emission, thereby generating the output signal. In these and other embodiments, the second combined signal may drive the second amplifier 226.

The second optical splitter 228 may receive the output signal from the second amplifier 226. The second optical splitter 228 may split and provide the output signal to the filter 230 and the output 225 of the EDFA 107. In some embodiments, the second optical splitter 228 may divide the optical power level of the output signal between the first output 275 and the second output 277 of the second optical splitter 228. In these and other embodiments, the second optical splitter 228 may equally or unequally divide the optical power level of the output signal between the first output 275 and the second output 277 of the second optical splitter 228. Additionally or alternatively, the filter 230 and the output 225 of the EDFA 107 may receive the output signal at divided optical power levels.

The filter 230 may receive the output signal at the divided optical power level from the second optical splitter 228. The filter 230 may generate a filtered signal based on the output signal. In some embodiments, the filter 230 may be a passband filter configured to permit portions of the output signal to pass through the filter 230. For example, the filter 230 may be configured as a L passband filter configured to permit optical signals within the L-band to pass through the filter 230 while blocking optical signals with wavelengths outside the L-band. In some embodiments, the filter 230 may be implemented as a device that is separate from the output photodiode 232. In other embodiments, the filter 230 may be implemented as a device that is integrated into or with the output photodiode 232. In some embodiments, the filter 230 may be implemented as a thin-film filter.

The output photodiode 232 may receive the filtered signal from the filter 230. The output photodiode 232 may generate the feedback signal based on the filtered signal. In some embodiments, the output photodiode 232 may generate the feedback signal as an electrical signal representative of the filtered signal. In these and other embodiments, a current level of the feedback signal may be based on the optical power level of the filtered signal.

The alarm device 231 may be configured to measure (e.g., monitor) the current level of the first driver signal generated by the feedback controller 224. The alarm device 231 may be configured to generate an alarm signal when the current level of the first driver signal exceeds a threshold value. In some embodiments, the threshold value may be a current level value equal to two times a current level of the first driver signal during proper operation of the EDFA 107 (e.g., the current level of the first driver signal when the EDFA 107 is properly operating). In other embodiments, the threshold value may be a current level value equal to 1090 milliamps (mA) or other value. In some embodiments, the alarm signal may indicate that the blind stage 202 (e.g., the first pump laser 212) has failed. In other embodiments, the alarm signal may indicate that a target optical power level of the output signal cannot be met by the non-blind stage 204. Additionally or alternatively, the alarm signal may indicate that the EDFA 107 has failed and the EDFA 107 is to be replaced or a system implementing the EDFA 107 (e.g., the system 100 of FIG. 1) is to be reconfigured to maintain proper operation.

In some embodiments, when the first pump laser 212 fails, the amplified signal generated by the first amplifier 216 may approach zero—or the first pump laser 212 may stop generating any amplified signal at all, which may cause the output signal generated by the second amplifier 226 to be primarily ASE in the C-band. In these and other embodiments, the filter 230 may be configured to filter out the C-band. For example, the filter 230 may be configured to prevent C-band ASE from passing through the filter 230, which may cause the filtered signal to also approach zero. Additionally or alternatively, the filtered signal approaching zero may cause the current level of the feedback signal to approach zero amps. Consequently, the feedback controller 224 may try to compensate for the decreasing optical power levels and current level by increasing the current level of the first driver signal to the second pump laser 222. The feedback controller 224 increasing the current level of the first driver signal may cause the current level of the first driver signal to exceed the threshold value. The alarm device 231 may generate the alarm signal when the feedback controller 224 increases the current level of the first driver signal such that the current level exceeds the threshold value.

Figure 3:
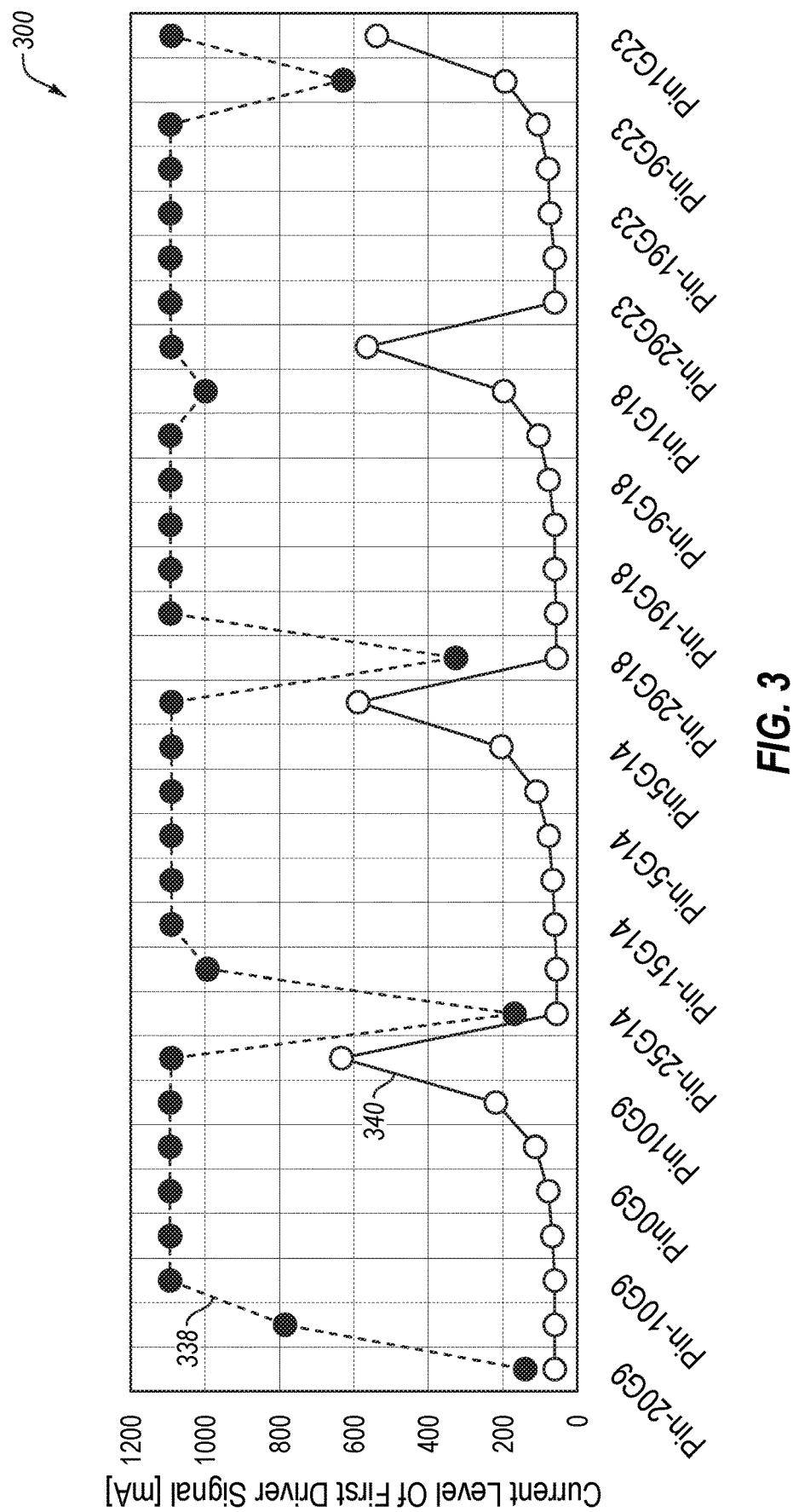
FIG. 3 illustrates a graphical representation of measured current levels of a first driver signal in the EDFA of FIG. 2 during simulations of various operation scenarios of the first pump laser.

FIG. 3 illustrates a graphical representation 300 of measured current levels of the first driver signal during simulations of various operation scenarios of the first pump laser 212, in accordance with at least one embodiment described in the present disclosure. The graphical representation 300 was obtained by measuring the current level of the first driver signal using various combinations of optical power level and gain within the EDFA 107. Table I includes the data used to generate the graphical representation 300 of FIG. 3 in a tabular format.

Each point along the horizontal axis of FIG. 3 and in the first column of Table I is formatted to specify the optical power into the EDFA 107 and the gain for the corresponding current level. For example, the first point in FIG. 3 and Table I is labeled "Pin-20G9" which means the optical power into the EDFA is −20 decibel milliwatts (dBm) and the gain is 9 decibels (dB) for the corresponding current level of 64 mA or 145 mA. As another example, the last point in FIG. 3 and Table I is "Pin1G23" which means the optical power into the EDFA is 1 dBm and the gain is 23 dB for the corresponding current level of 542 mA or 1092 mA.

The various combinations of optical power levels and gains are listed in Table I below for each point with the corresponding current level for proper operation and the corresponding current level for failing operation. Curve 338 in FIG. 3 graphically represents the current levels of the first driver signal that were measured in the simulations of failing operation scenarios. Curve 340 in FIG. 3 graphically represents the current levels of the first driver signal that were measured in simulations of proper operation scenarios.

As illustrated in FIG. 3 and Table I, in the simulations of the failing operation scenarios, the current level of the first driver signal exceeds 1000 mA for most of the optical power level and gain combinations. In addition, as illustrated in FIG. 3 and Table I, in the simulations of the failing operation scenarios, the current level of the first driver signal exceeds two times the corresponding current level of the first driver signal in the simulations of the proper operation scenarios for each of the optical power level and gain combinations.

TABLE I

| | Optical Power Level [dB] | Gain [dB] | Current Level [mA] Proper Operation | Current Level [mA] Failing Operation |
|---|---|---|---|---|
| Pin-20G9 | −20 | 9 | 64 | 145 |
| Pin-15G9 | −15 | 9 | 63 | 788 |
| Pin-10G9 | −10 | 9 | 65 | 1094 |
| Pin-5G9 | −5 | 9 | 70 | 1094 |
| Pin0G9 | 0 | 9 | 83 | 1094 |
| Pin5G9 | 5 | 9 | 117 | 1094 |
| Pin10G9 | 10 | 9 | 222 | 1093 |
| Pin15G9 | 15 | 9 | 637 | 1092 |
| Pin-25G14 | −25 | 14 | 62 | 178 |
| Pin-20G14 | −20 | 14 | 62 | 997 |
| Pin-15G14 | −15 | 14 | 64 | 1094 |
| Pin-10G14 | −10 | 14 | 69 | 1094 |
| Pin-5G14 | −5 | 14 | 80 | 1094 |
| Pin0G14 | 0 | 14 | 112 | 1094 |
| Pin5G14 | 5 | 14 | 208 | 1093 |
| Pin10G14 | 10 | 14 | 594 | 1092 |
| Pin-29G18 | −29 | 18 | 61 | 329 |
| Pin-24G18 | −24 | 18 | 62 | 1094 |
| Pin-19G18 | −19 | 18 | 64 | 1094 |
| Pin-14G18 | −14 | 18 | 68 | 1094 |
| Pin-9G18 | −9 | 18 | 79 | 1094 |
| Pin-4G18 | −4 | 18 | 109 | 1094 |
| Pin1G18 | 1 | 18 | 201 | 1002 |
| Pin6G18 | 6 | 18 | 566 | 1092 |
| Pin-29G23 | −29 | 23 | 67 | 1094 |
| Pin-24G23 | −24 | 23 | 68 | 1094 |
| Pin-19G23 | −19 | 23 | 75 | 1094 |
| Pin-14G23 | −14 | 23 | 81 | 1094 |
| Pin-9G23 | −9 | 23 | 110 | 1094 |
| Pin-4G23 | −4 | 23 | 197 | 629 |
| Pin1G23 | 1 | 23 | 542 | 1092 |

Figure 4:
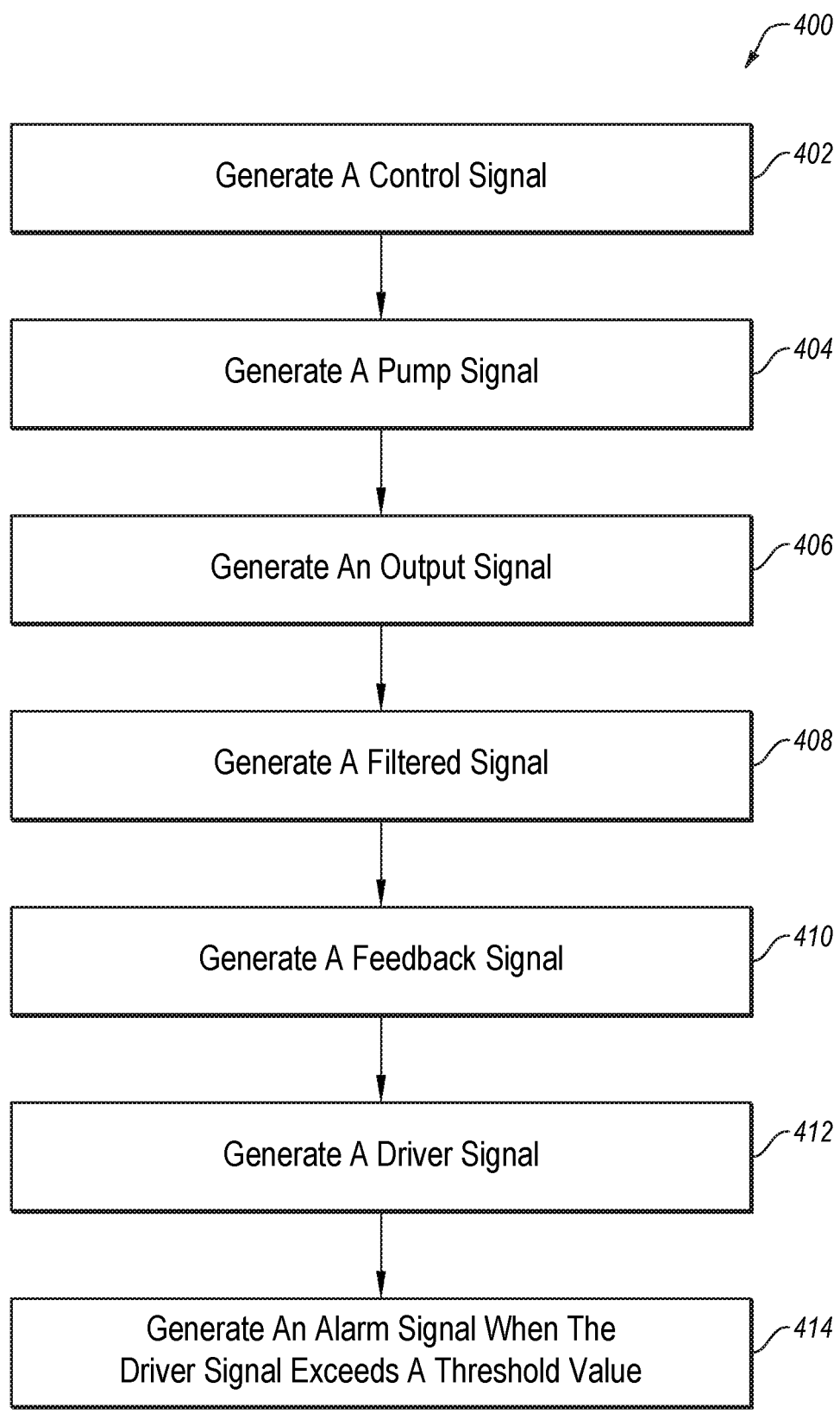
FIG. 4 illustrates a flowchart of an example method to generate an alarm signal when a driver signal exceeds a threshold value, all arranged in accordance with at least one embodiment described in the present disclosure.

FIG. 4 illustrates a flowchart of an example method 400 to generate an alarm signal when a driver signal exceeds a threshold value, in accordance with at least one embodiment described in the present disclosure. The method 400 may be performed by any suitable system, apparatus, or device. For example, the EDFA 107 of FIG. 2 may perform or direct performance of one or more of the operations associated with the method 400. The method 400 may include one or more of blocks 402, 404, 406, 408, 410, 412, or 414. Although illustrated with discrete blocks, the steps and operations associated with one or more of the blocks of the method 400 may be divided into additional blocks, combined into fewer blocks, or eliminated, depending on the particular implementation.

At block 402, a control signal may be generated. In some embodiments, the control signal may be generated based on an input signal. For example, the input photodiode 208 of FIG. 2 may generate the control signal based on the input signal.

At block 404, an amplified signal may be generated. In some embodiments, the amplified signal may be generated based on the control signal and the input signal. For example, the blind stage 202 of FIG. 2 may generate the amplified signal based on the control signal and the input signal.

At block 406, an output signal may be generated. In some embodiments, the output signal may be generated based on the amplified signal, the control signal, and a feedback signal. For example, the non-blind stage 204 may generate the output signal based on the amplified signal, the control signal, and the feedback signal.

At block 408, a filtered signal may be generated. In some embodiments, the filtered signal may be generated based on the output signal. For example, the filter 230 of FIG. 2 may generate the filtered signal based on the output signal.

At block 410 a feedback signal may be generated. In some embodiments, the feedback signal may be generated based on the filtered signal. For example, the output photodiode 232 of FIG. 2 may generate the feedback signal based on the filtered signal.

At block 412, a driver signal may be generated. In some embodiments, the driver signal may be generated based on the feedback signal and the control signal. For example, the feedback controller 224 of FIG. 2 may generate the driver signal (e.g., the first driver signal) based on the feedback signal and the control signal.

At block 414, an alarm signal may be generated when the driver signal exceeds a threshold value. For example, the alarm signal may be generated by the alarm device 231 when the current level of the first driver signal exceeds the threshold value. In some embodiments, the alarm signal may indicate that the EDFA (e.g., the blind stage) has failed.

Modifications, additions, or omissions may be made to the method 400 without departing from the scope of the present disclosure. For example, the operations of method 400 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the described embodiments.

An example method to detect failure of a feed-forward pump laser (e.g., the first pump laser 212) in an L-band optical fiber amplifier (e.g., the EDFA 107) may include adding a C/L-band filter before an input (e.g., the input 279) of an output photodiode (e.g., the output photodiode 232). The method may include obtaining a current value (e.g., of a driver signal) of a feedback pump laser (e.g., the second pump laser 222) and a normal working current value at a corresponding moment. The normal working current value may be obtained in a production test and recorded in a modular memory for a determination by modular software of the L-band optical fiber amplifier. The method may include determining whether the obtained current value of the feedback pump laser is greater than a threshold current value. The threshold current value may include a maximum nominal working current of the feedback pump laser. The method may include determining whether the current value of the feedback pump laser is greater than twice the normal working current value. The method may also include triggering an alarm signal when the current value of the feedback pump laser is greater than the threshold current value or greater than twice the normal working current value.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An erbium doped fiber amplifier (EDFA), comprising:
   an input photodiode configured to generate a control signal based on an input signal;
       a first stage coupled to the input photodiode, the first stage configured to generate an amplified signal based on the control signal from the input photodiode and the input signal;
       a second stage coupled to the input photodiode and the first stage, the second stage configured to generate an output signal based on the amplified signal of the first stage, the control signal from the input photodiode, and a feedback signal, wherein a driver signal within the second stage is generated based on the feedback signal and the control signal from the input photodiode;
   an output photodiode configured to generate the feedback signal based on the output signal; and
   an alarm device coupled to the second stage, wherein the alarm device is configured to generate an alarm signal when the driver signal within the second stage exceeds a threshold value, wherein, when the first stage fails, the amplified signal within the first stage approaches zero, which causes the feedback signal from the output photodiode to approach zero and the driver signal within the second stage to increase and exceed the threshold value.

2. An erbium doped fiber amplifier (EDFA), comprising:
   an input photodiode configured to generate a control signal based on an input signal;
       a first stage coupled to the input photodiode, the first stage configured to generate an amplified signal based on the control signal from the input photodiode and the input signal;
       a second stage coupled to the input photodiode and the first stage, the second stage configured to generate an output signal based on the amplified signal of the first stage, the control signal from the input photodiode, and a feedback signal, wherein a driver signal within the second stage is generated based on the feedback signal and the control signal from the input photodiode;
   a filter coupled to the second stage, the filter configured to generate a filtered signal based on the output signal from the second stage;

an output photodiode coupled to the filter, the output photodiode configured to generate the feedback signal based on the filtered signal from the filter; and an alarm device coupled to the second stage, wherein the alarm device is configured to generate an alarm signal when the driver signal within the second stage exceeds a threshold value, wherein, when the first stage fails, the amplified signal within the first stage approaches zero, the second stage generates the output signal as an amplified spontaneous emission (ASE) and the filter is configured to filter out the ASE, which causes the filtered signal from the filter and the feedback signal from the output photodiode to approach zero and the driver signal within the second stage to increase and exceed the threshold value.

3. An erbium doped fiber amplifier (EDFA), comprising:
an input photodiode configured to generate a control signal based on an input signal;
 a first stage coupled to the input photodiode, the first stage configured to generate an amplified signal based on the control signal from the input photodiode and the input signal;
 a second stage coupled to the input photodiode and the first stage, the second stage configured to generate an output signal based on the amplified signal of the first stage, the control signal from the input photodiode, and a feedback signal, wherein a driver signal within the second stage is generated based on the feedback signal and the control signal from the input photodiode;
a filter coupled to the second stage, the filter configured to generate a filtered signal based on the output signal from the second stage;
an output photodiode coupled to the filter, the output photodiode configured to generate the feedback signal based on the filtered signal from the filter; and
an alarm device coupled to the second stage, wherein the alarm device is configured to generate an alarm signal when the driver signal within the second stage exceeds a threshold value,
wherein:
the EDFA is configured as a L-band amplifier; and
the filter comprises a C/L filter configured to filter out signals in a C-band.

4. The EDFA of claim 1, wherein the alarm device is configured to measure a current of the driver signal within the second stage.

5. The EDFA of claim 1, wherein the first stage comprises a feed forward controller coupled to the input photodiode, the feed forward controller is configured to generate a driver signal within the first stage based on the control signal from the input photodiode, and the amplified signal within the first stage is based on the driver signal within the first stage and the input signal.

6. The EDFA of claim 5, wherein the second stage comprises a feedback controller coupled to the input photodiode and the output photodiode, the feedback controller configured to generate the driver signal within the second stage based on the control signal from the input photodiode and the feedback signal from the output photodiode, and the output signal is based on the driver signal within the second stage and the amplified signal within the first stage.

7. The EDFA of claim 6, wherein the first stage further comprises:
 a first pump laser coupled to the feed forward controller, the first pump laser configured to generate a first pump light based on the driver signal within the first stage;
 a first combiner coupled to the first pump laser, the first combiner configured to generate a first combined signal based on the input signal and the first pump light from the first pump laser; and
 a first amplifier coupled to the first combiner, the first amplifier configured to amplify the first combined signal from the first combiner to generate the amplified signal.

8. The EDFA of claim 7, wherein the second stage further comprises:
 a second pump laser coupled to the feedback controller, the second pump laser configured to generate a second pump light based on the driver signal within the second stage;
 a second combiner coupled to the second pump laser and the first amplifier, the second combiner configured to generate a second combined signal based on the amplified signal from the first amplifier and the second pump light from the second pump laser; and
 a second amplifier coupled to the second combiner, the second amplifier configured to amplify the second combined signal from the second combiner to generate the output signal.

9. An erbium doped fiber amplifier (EDFA), comprising:
an input photodiode optically coupled to an input of the EDFA;
a feed forward controller electrically coupled to an output of the input photodiode;
a first pump laser electrically coupled to an output of the feed forward controller;
a first amplifier optically coupled to an output of the first pump laser and the input of the EDFA;
a feedback controller electrically coupled to the output of the input photodiode;
a second pump laser electrically coupled to an output of the feedback controller;
a second amplifier optically coupled to an output of the second pump laser, an output of the first amplifier, and an output of the EDFA;
an output photodiode optically coupled to an output of the second amplifier filter and electrically coupled to an input of the feedback controller; and
an alarm device coupled to the feedback controller, wherein, when the first pump laser fails, the first amplifier decreases, which causes the output photodiode to decrease and the feedback controller to increase.

10. The EDFA of claim 9 further comprising an optical splitter optically coupled to the input of the EDFA, an input of the input photodiode, and an input of the first amplifier.

11. The EDFA of claim 10 further comprising an optical combiner optically coupled to an output of the optical splitter, the output of the first pump laser, and the input of the first amplifier.

12. The EDFA of claim 9 further comprising an optical isolator optically coupled to the output of the first amplifier and an input of the second amplifier.

13. The EDFA of claim 12 further comprising an optical combiner optically coupled to an output of the optical isolator, the output of the second pump laser, and the input of the second amplifier.

14. The EDFA of claim 9 further comprising an optical splitter optically coupled to the output of the second amplifier, an input of a filter, and the output of the EDFA.

15. A method comprising:
generating a control signal, by an input photodiode, based on an input signal;

generating an amplified signal, by a first amplifier, based on the control signal and the input signal;
generating an output signal, by a second amplifier, based on the amplified signal, the control signal, and a feedback signal;
generating the feedback signal, by an output photodiode, based on the output signal;
generating a driver signal, by a feed forward controller, based on the feedback signal and the control signal; and
generating an alarm signal, by an alarm device, when the driver signal exceeds a threshold value, wherein, when the amplified signal approaches zero, the feedback signal approaches zero and the driver signal increases and exceeds the threshold value.

16. A method comprising:
generating a control signal, by an input photodiode, based on an input signal;
generating an amplified signal, by a first amplifier, based on the control signal and the input signal;
generating an output signal, by a second amplifier, based on the amplified signal, the control signal, and a feedback signal;
generating a filtered signal, by a filter, based on the output signal;
generating the feedback signal, by an output photodiode, based on the filtered signal;
generating a driver signal, by a feed forward controller, based on the feedback signal and the control signal; and
generating an alarm signal, by an alarm device, when the driver signal exceeds a threshold value, wherein, when the amplified signal approaches zero, the output signal is generated as an amplified spontaneous emission (ASE), which causes the filtered signal and the feedback signal to approach zero and the driver signal to increase and exceed the threshold value.

17. A method comprising:
generating a control signal, by an input photodiode, based on an input signal;
generating an amplified signal, by a first amplifier, based on the control signal and the input signal;
generating an output signal, by a second amplifier, based on the amplified signal, the control signal, and a feedback signal;
generating a filtered signal, by a filter, based on the output signal;
generating the feedback signal, by an output photodiode, based on the filtered signal;
generating a driver signal, by a feed forward controller, based on the feedback signal and the control signal; and
generating an alarm signal, by an alarm device, when the driver signal exceeds a threshold value,
determining a current level of the driver signal, wherein the threshold value is a current level.

18. The method of claim 15, wherein the driver signal is a first driver signal, the method further comprising generating a second driver signal based on the control signal, wherein the amplified signal is generated based on the second driver signal and the input signal.

19. The method of claim 18 further comprising generating a first pump light based on the second driver signal, wherein the amplified signal is based on the first pump light.

20. The method of claim 19 further comprising generating a second pump light based on the first driver signal, wherein the output signal is based on the second pump light and the amplified signal.

21. The EDFA of claim 1, further comprising a filter coupled to the second stage, the filter configured to generate a filtered signal based on the output signal from the second stage, wherein the output photodiode is coupled to the filter, and wherein the output photodiode is configured to generate the feedback signal based on the filtered signal from the filter, wherein the filtered signal is based on the output signal.

22. The EDFA of claim 9 further comprising a filter optically coupled to an output of the second amplifier, wherein the output photodiode is optically coupled to the output of the filter, and the second amplifier is coupled to the filter.

23. The method of claim 15, further comprising generating a filtered signal based on the output signal, wherein the feedback signal is generated based on the filtered signal, wherein the filtered signal is based on the output signal.

* * * * *